(12) United States Patent
Nagata

(10) Patent No.: US 9,961,818 B2
(45) Date of Patent: May 1, 2018

(54) ELECTRONIC COMPONENT MOUNTING MACHINE INCLUDING A FILM THICKNESS GAUGE

(71) Applicant: FUJI MACHINE MFG. CO., LTD., Chiryu (JP)

(72) Inventor: Yoshinori Nagata, Anjo (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 21 days.

(21) Appl. No.: 15/102,941

(22) PCT Filed: Dec. 23, 2013

(86) PCT No.: PCT/JP2013/084387
§ 371 (c)(1),
(2) Date: Jun. 9, 2016

(87) PCT Pub. No.: WO2015/097731
PCT Pub. Date: Jul. 2, 2015

(65) Prior Publication Data
US 2016/0330882 A1    Nov. 10, 2016

(51) Int. Cl.
*H05K 13/04* (2006.01)
*B05C 11/10* (2006.01)
(Continued)

(52) U.S. Cl.
CPC ........ *H05K 13/0469* (2013.01); *B05C 11/101* (2013.01); *B05C 11/11* (2013.01);
(Continued)

(58) Field of Classification Search
CPC .......... H05K 14/0404; H05K 14/0469; H05K 14/08; H05K 2203/0139; H05K 2203/163;
(Continued)

(56) References Cited

U.S. PATENT DOCUMENTS 4,869,418 A  *  9/1989  Simpson .................. B23K 1/08
                                                 118/423
5,040,291 A  *  8/1991  Janisiewicz ........... B23P 19/007
                                                  29/740
(Continued)

FOREIGN PATENT DOCUMENTS

JP         2008-130985 A      6/2008

OTHER PUBLICATIONS

International Search Report dated Mar. 18, 2014 in PCT/JP2013/084387, filed Dec. 23, 2013.

*Primary Examiner* — Karl Kurple
(74) *Attorney, Agent, or Firm* — Oblon, McClelland, Maier & Neustadt, L.L.P.

(57) ABSTRACT

An electronic component mounting machine is provided with a film thickness gage. The film thickness gage is provided with measurement sections. The mounting head moves to a position above the storage section and lowers the film thickness gage to cause the film thickness gage to come into contact with the flux film. In the film thickness gage, the measurement sections form measurement marks corresponding to the film thickness in the flux film. The electronic component mounting machine images the measurement marks using a mark camera, and determines the film thickness of the flux film which is actually formed based on imaging data.

5 Claims, 10 Drawing Sheets

(51) Int. Cl.
*B05C 11/11* (2006.01)
*H05K 13/08* (2006.01)
*H05K 3/34* (2006.01)
*B67D 1/08* (2006.01)

(52) U.S. Cl.
CPC ....... H05K 3/3489 (2013.01); H05K 13/0404 (2013.01); H05K 13/08 (2013.01); B67D 1/0871 (2013.01); *H05K 2203/0139* (2013.01); *H05K 2203/163* (2013.01)

(58) Field of Classification Search
CPC ............ H05K 3/3489; H05K 13/0404; H05K 13/0469; H05K 13/08; B67D 1/0871; B05C 11/101; B05C 11/11
USPC ............................................ 73/865.8, 290 R
See application file for complete search history.

(56) References Cited

U.S. PATENT DOCUMENTS

| | | | | |
|---|---|---|---|---|
| 5,460,968 A * | 10/1995 | Yoshida | ........... | G01N 35/00029 422/62 |
| 6,382,390 B1 * | 5/2002 | Asai | ........... | H05K 13/02 198/346.1 |
| 6,546,797 B2 * | 4/2003 | Burns | ........... | G01F 23/686 73/290 R |
| 6,672,156 B1 * | 1/2004 | Burns | ........... | G01F 23/686 73/290 R |
| 7,353,596 B2 * | 4/2008 | Shida | ........... | H01L 21/67144 228/180.22 |
| 7,690,403 B2 * | 4/2010 | You | ........... | B67D 1/0871 141/198 |
| 7,797,820 B2 * | 9/2010 | Shida | ........... | H01L 21/67144 228/180.21 |
| 2003/0077396 A1 * | 4/2003 | LeCompte | ........... | B05C 3/09 427/430.1 |
| 2005/0183282 A1 * | 8/2005 | Watanabe | ........... | G01B 11/0625 33/836 |
| 2007/0084283 A1 * | 4/2007 | Carlson | ........... | G01F 1/007 73/290 V |
| 2008/0163481 A1 * | 7/2008 | Shida | ........... | H01L 21/67144 29/740 |
| 2014/0151437 A1 * | 6/2014 | Choi | ........... | H01L 24/81 228/8 |
| 2014/0230727 A1 * | 8/2014 | Suriawidjaja | ........... | B05C 11/00 118/712 |

* cited by examiner

ELECTRONIC COMPONENT MOUNTING MACHINE INCLUDING A FILM THICKNESS GAUGE

TECHNICAL FIELD

The present disclosure relates to an electronic component mounting machine which is provided with a transfer device which transfers a viscous fluid. In particular, the present disclosure relates to an electronic component mounting machine which measures a film thickness of a fluid film which the transfer device forms using the viscous fluid.

BACKGROUND ART

In the related art, there is an electronic component mounting machine which is provided with a transfer device which transfers a flux onto electrodes (bumps) of an electronic component to be mounted, for example, a ball grid array (BGA) electronic component (for example, PTL 1 or the like). In the electronic component mounting machine, before soldering the electronic component which is held by a suction nozzle of a mounting head to a circuit board, the electronic component is dipped in a flux film which is formed in advance by the transfer device to transfer the flux onto the electrodes, and the soldering is subsequently performed.

The amount of the flux which is transferred onto the electrodes of the electronic component affects the wettability of the solder, and influences the performance of the circuit board after the electronic component is mounted. Meanwhile, the flux generally contains a volatile solvent, and when a state in which the flux is formed as a flux film on a storage section of the transfer device continues, the solvent evaporates into the air, the viscosity changes, and the mechanically set film thickness changes with time. In the transfer device which is used in the mounting of this type of electronic component, the viscous fluid is not limited to the flux, and other viscous fluids (for example, solder) are also used; however, it is necessary to adjust the film thickness of the fluid film which is formed using the viscous fluid according to the pitch of the electrodes, the height dimension of the electrodes, and the like of the electronic component to be mounted. Therefore, for example, every time the type of electronic component being supplied is replaced, it is necessary for the electronic component mounting machine to adjust the film thickness of the fluid film of the transfer device according to the type of the electronic component. Therefore, it is necessary for the film thickness of the fluid film to be appropriately managed.

In the electronic component mounting machine which is disclosed in PTL 1 described above, the film thickness of the flux film which is formed changes according to the size of the gap between a top face of a transport belt on which the flux is placed and which conveys the flux, and a tip of a blade which is positioned on top of the transport belt and is pressed into the flux to be conveyed. Therefore, in the electronic component mounting machine, the size of the gap is changed and the film thickness of the flux film is adjusted by changing the position of the blade. The electronic component mounting machine is provided with a film thickness detection sensor for measuring the film thickness of the flux film, and the measurement result of the film thickness detection sensor is input to a control section. The control section compares the measurement result with a target value which is set in advance, and determines whether or not the film thickness is appropriate. The control section repeatedly executes feedback control in which the blade is moved according to the measurement result, and adjusts the position of the blade until the film thickness is a suitable value.

CITATION LIST

Patent Literature

PTL 1: JP-A-2008-130985

SUMMARY

Technical Problem

However, in order to install the film thickness detection sensor (for example, a laser sensor) in the electronic component mounting machine described above, a dedicated power source device (high voltage source) which drives the sensor, various cables which connect the sensor and the power source device to each other, and the like become necessary, and this leads to an increase in the complexity of the structure of the device and an increase in the size of the device itself. In the electronic component mounting machine, an increase in the manufacturing cost of the device caused by installing the film thickness detection sensor and dedicated devices becomes a problem.

The present disclosure was made in consideration of this problem, and an object of the disclosure is to provide an electronic component mounting machine which is provided with a transfer device which transfers a viscous fluid, in which it is possible to appropriately manage a film thickness of a fluid film which the transfer device forms using the viscous fluid, and it is possible to decrease the size of the device and to simplify the structure of the device, thus enabling a reduction in manufacturing costs.

Solution to Problem

An electronic component mounting machine according to the technology disclosed in the present application in light of the above problems includes a storage section in which a viscous fluid is stored and a fluid film of the viscous fluid is formed, a movable section which holds an electronic component, moves, and dips the electronic component in the fluid film, a film thickness gauge which forms measurement marks corresponding to measurement values in the fluid film by coming into contact with the fluid film, the measurement marks being for measuring a film thickness of the fluid film, and an imaging section which images the measurement marks which are formed in the fluid film by the film thickness gauge, in which the electronic component mounting machine detects the film thickness of the fluid film based on imaging data by the imaging section.

Effects

According to the technology disclosed in the present application, it is possible to provide an electronic component mounting machine in which it is possible to appropriately manage a film thickness of a fluid film which a transfer device forms using a viscous fluid, and it is possible to decrease the size of the device and to simplify the structure of the device, thus enabling a reduction in manufacturing costs.

DESCRIPTION OF EMBODIMENTS

Figure 1:
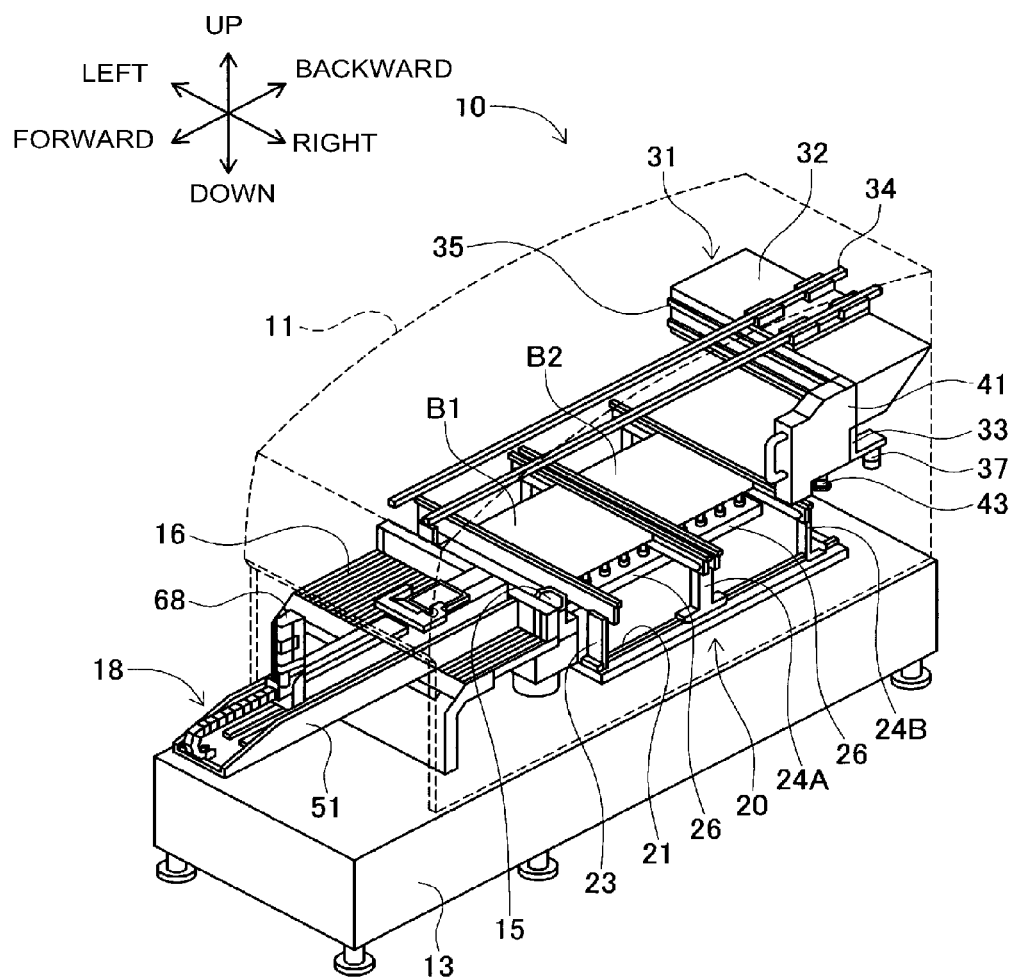
FIG. 1 is a perspective diagram of an electronic component mounting machine to which a flux unit of an embodiment is attached.
Figure 2:
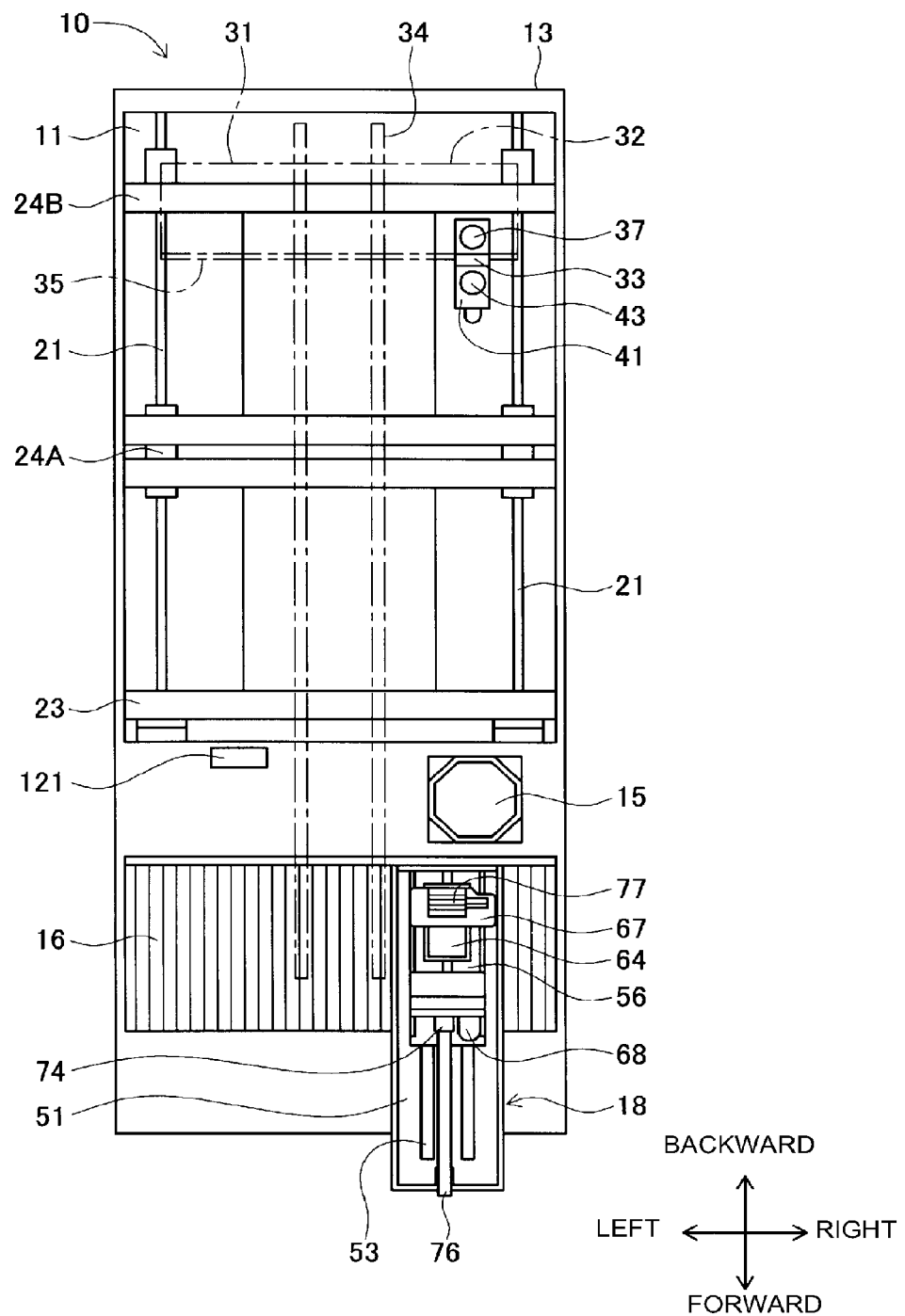
FIG. 2 is a top face diagram of the electronic component mounting machine.

Hereinafter, an embodiment which embodies the present disclosure will be described with reference to the drawings. FIG. 1 is a perspective diagram of an electronic component mounting machine 10 and depicts a portion of a housing 11 of the electronic component mounting machine 10 being made transparent. FIG. 2 is a top face diagram of the electronic component mounting machine 10. The electronic component mounting machine 10 is a device which mounts electronic components onto circuit boards B1 and B2 which are conveyed thereto.

In the electronic component mounting machine 10, various devices which are covered by the housing 11 are provided on a base 13 which is disposed on a floor surface of a manufacturing factory or the like in which the electronic component mounting machine 10 is installed. The base 13 is formed in a substantially parallelepiped shape. In a board conveyance device 20, a pair of guide rails 21 which are provided to extend along the longitudinal direction of the base 13 are displaced on the base 13. In the following description, description will be given referring to a direction in which the pair of guide rails 21 are provided to extend as a forward-backward direction, a direction (the direction in which the circuit boards B1 and B2 are conveyed) which is perpendicular to the forward-backward direction and is horizontal in relation to an installation surface of the device as a left-right direction, and a direction which is perpendicular to both the forward-backward direction and the left-right direction as an up-down direction.

A fixed wall 23 which is provided to stand on the top face of a substantially center portion of the base 13 is provided on the board conveyance device 20. The front ends of the pair of guide rails 21 are connected to both end portions in the left-right direction of the fixed wall 23. Two movable walls 24A and 24B are disposed on the rear side of the fixed wall 23. Both end portions in the left-right direction of each of the two movable walls 24A and 24B are attached to the guide rail 21 to be capable of sliding in the forward-backward direction.

A lane which conveys the circuit board B1 in the left-right direction is formed between the fixed wall 23 and the movable wall 24A in the forward-backward direction. Similarly, a lane which conveys the circuit board B2 in the left-right direction is formed between the movable walls 24A and 24B in the forward-backward direction. The conveyance width of each of the two lanes can be expanded and contracted. The top portion of each of the fixed wall 23 and the movable walls 24A and 24B is provided with a conveyor belt for conveying the circuit boards B1 and B2 in the left-right direction. For example, the circuit board B1 is conveyed from the left toward the right on the lane by the conveyor belts which are respectively provided on the fixed wall 23 and the movable wall 24A.

A back-up table 26 for fixing the circuit boards B1 and B2 is provided in each of the two lanes which are formed by the fixed wall 23 and the two movable walls 24A and 24B. Each of the back-up tables 26 is provided on the base 13 which is beneath the circuit boards B1 and B2, and is configured to be capable of being lifted and lowered in the up-down direction. Multiple back-up pins are provided on a long plate-shaped top face of each of the back-up tables 26, and each of the circuit boards B1 and B2 is held in a fixed manner by being supported from below by the back-up pins.

An XY robot 31 is provided on the top portion of the electronic component mounting machine 10. The XY robot 31 is provided with a Y-direction slider 32, an X-direction slider 33, a pair of left and right Y-direction guide rails 34, and a pair of upper and lower X-direction guide rails 35. In order to avoid the diagram becoming convoluted, FIG. 2 illustrates the Y-direction slider 32, the Y-direction guide rails 34, and the X-direction guide rails 35 using dot-and-dash lines. The X direction corresponds to the left-right direction, and the Y direction corresponds to the forward-backward direction.

Each of the pair of Y-direction guide rails 34 is disposed on a portion close to the top face of the housing 11 in the inner portion space thereof, and is provided to extend in the forward-backward direction. The Y-direction slider 32 is attached to the Y-direction guide rails 34 to be capable of sliding in the forward-backward direction. Each of the X-direction guide rails 35 is disposed on the front face of the Y-direction slider 32, and is provided to extend in the left-right direction. The X-direction slider 33 is attached to the X-direction guide rails 35 to be capable of sliding in the left-right direction. A mark camera 37 for imaging fiducial marks, the model number, and the like which are attached to the surfaces of the circuit boards B1 and B2 is attached to the bottom face of the X-direction slider 33. The mark camera 37 is fixed to the X-direction slider 33 in a state of facing downward, and is capable of imaging an arbitrary position on the base 13 due to the XY robot 31. In the electronic component mounting machine 10 of the present embodiment, the mark camera 37 is also used in the imaging of a flux film F of a flux unit 18 which is described later.

A mounting head 41 is attached to the X-direction slider 33. The mounting head 41 is configured to be capable of moving to an arbitrary position on the base 13 due to the XY robot 31. The mounting head 41 is configured to be capable of sliding in the up-down direction in relation to the X-direction slider 33. In the electronic component mounting machine 10, a parts camera 15 is provided in a position of the front side of the fixed wall 23 on the base 13. The parts camera 15 is used for imaging the electronic components which are sucked by suction nozzles 43 of the mounting head 41.

Figure 3:
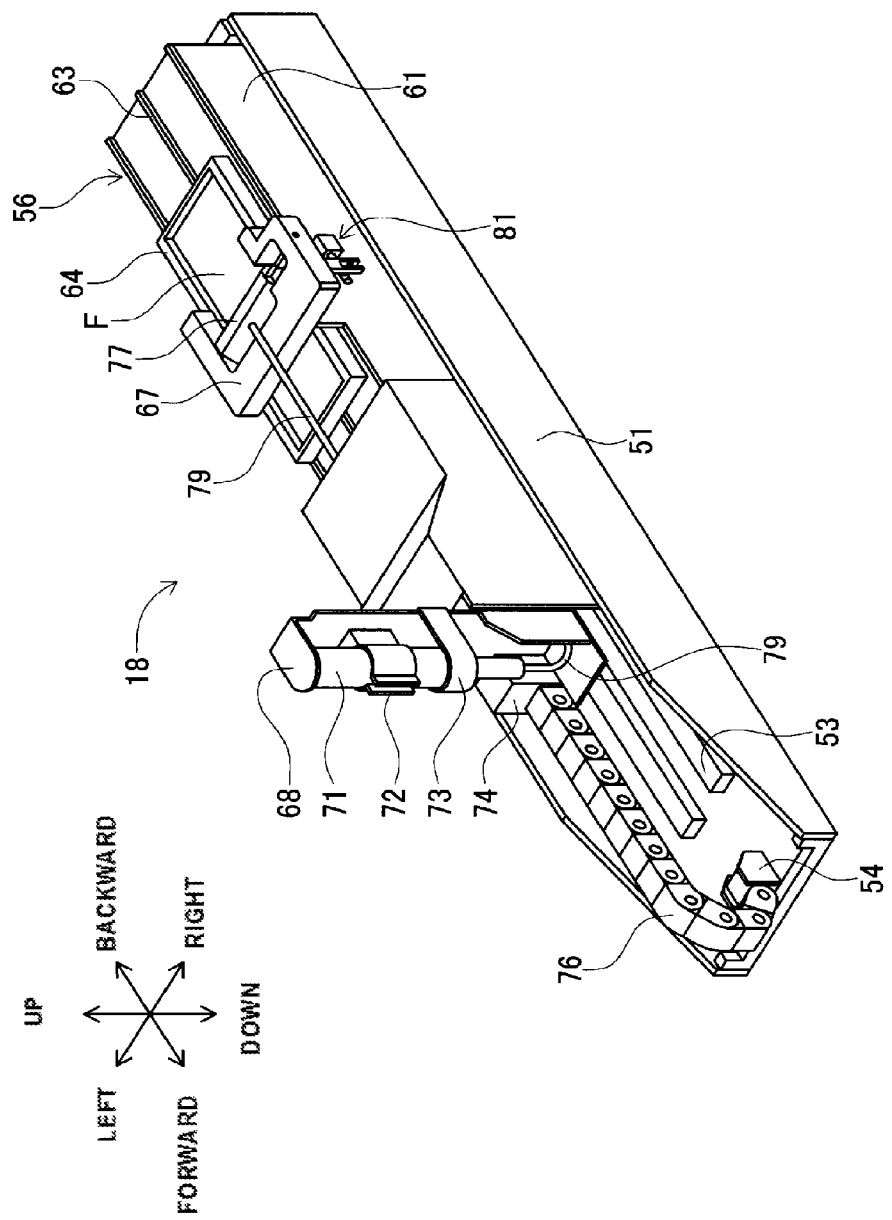
FIG. 3 is a perspective diagram of the flux unit.

In the electronic component mounting machine 10, a device table 16 is provided on the top face of the front side of the base 13 to be capable of sliding in the forward-backward direction. The flux unit 18 is attached to the top face of the device table 16. FIG. 3 is a perspective diagram of the flux unit 18. A base section 51 of the flux unit 18 is attached to the top face of the device table 16 (refer to FIGS. 1 and 2). The base section 51 is provided with a rectangular bottom plate which is provided to extend in the forward-backward direction, and a pair of side plates which extend vertically upward from the end portions of the left-right direction of the bottom plate, and forms a U-character shaped groove extending in the forward-backward direction. A pair of guide rails 53 which face each other in the left-right direction and are provided to extend along the forward-backward direction are installed on the top face of the bottom plate of the base section 51. A cable connecting section 54 is provided on the end portion of the front side on the bottom plate of the base section 51.

The flux unit 18 is provided with a unit main body section 56 which is connected to the cable connecting section 54 and is capable of moving in the forward-backward direction along the guide rails 53. The unit main body section 56 is provided with a parallelepiped seat 61 which extends in the forward-backward direction. The seat 61 is formed to be a size which fits in the U-character shaped groove of the base section 51. A guided section which is formed to match the shape of the guide rails 53 which are provided on the bottom plate of the base section 51 is provided in the seat 61, and the unit main body section 56 is configured to be capable of moving in the forward-backward direction in relation to the guide rails 53 (the base section 51) due to an actuator (not illustrated).

One guide rail 63 which is provided to extend in the forward-backward direction is installed on the top face of the seat 61. A storage section 64 in which the flux is stored is provided on the seat 61. A guided section which is formed to match the shape of the guide rail 63 is provided in the storage section 64, and the storage section 64 is configured to be capable of moving in the forward-backward direction in relation to the guide rail 63 (the unit main body section 56) due to an actuator (not illustrated). In the storage section 64, the flux is stored in a shallow-bottom tray with a longitudinal shape in which, as viewed from above, a longitudinal direction is the forward-backward direction. The flux film F is formed in the tray of the storage section 64. In the storage section 64, a frame 67 is provided on the top portion of the tray. The frame 67 is formed such that the shape as viewed from above is a substantially U-character shaped plate shape with an open rear side. The frame 67 is provided to bridge from both ends on the left and right of the seat 61 so as to straddle the storage section 64 in the left-right direction.

A syringe holding section 68 is provided on the front end portion of the unit main body section 56. In the syringe holding section 68, a cylindrical syringe 71 is fixed by a clip 72 and a belt 73. The flux is stored in the inner portion of the syringe 71. In the syringe holding section 68, a cable connecting section 74 which is provided on the lower portion is connected to the cable connecting section 54 of the base section 51 by a cable 76. Various power source lines, signal lines, and the like are housed in the cable 76.

Figure 4:
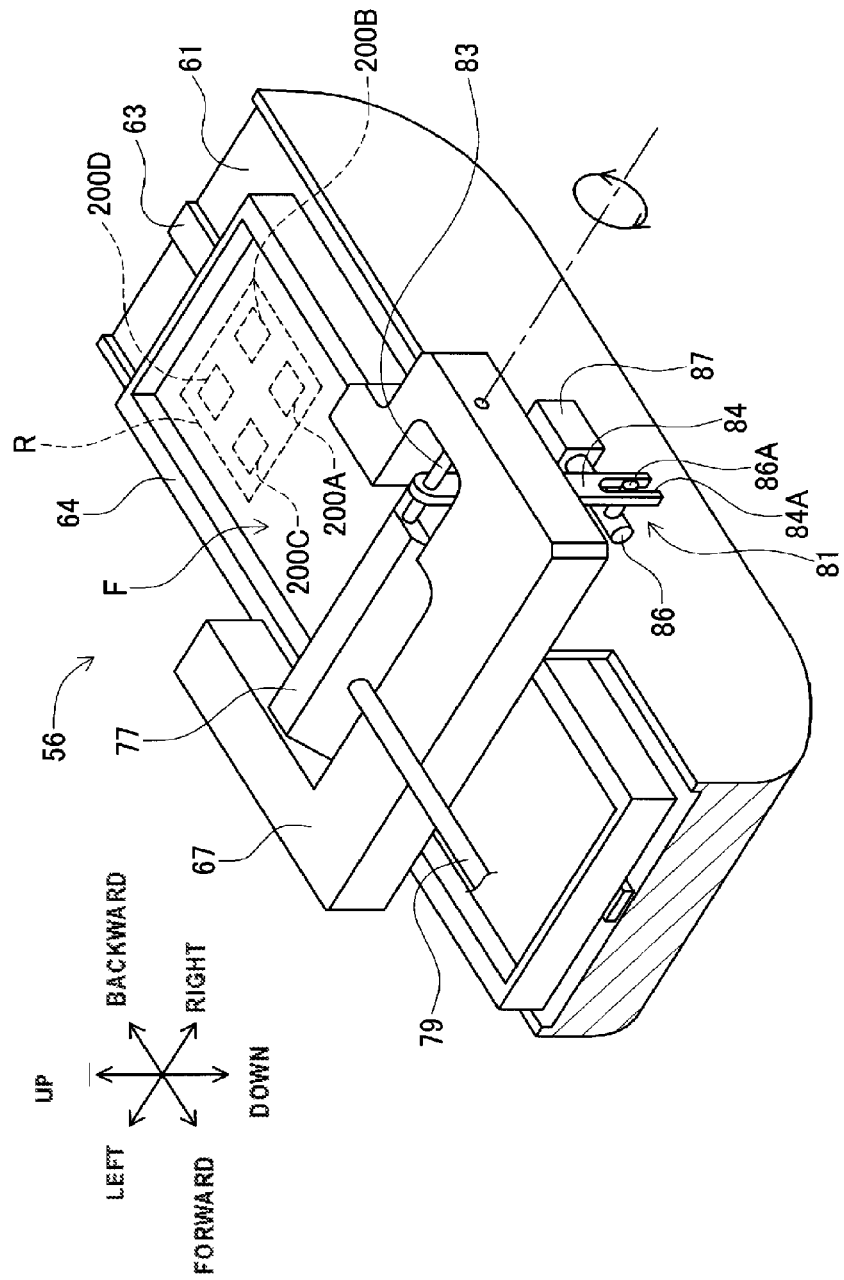
FIG. 4 is a perspective diagram in which a portion of the flux unit at which a storage section is provided is enlarged.

A squeegee 77 is attached to the frame 67 on the inside of the U-character shaped opening to be capable of rocking via a rocking shaft 83 (refer to FIG. 4). The squeegee 77 is formed in a shape which, as viewed from the left-right direction, is a V-character plate shape (refer to FIG. 9) open on the bottom side. A liquid pumping tube 79 is attached to the bottom face of the syringe 71. One end of the liquid pumping tube 79 is connected to the syringe 71, the other end is connected to the squeegee 77, and the liquid pumping tube 79 communicates the inside of the syringe 71 with the inside of the V-shaped opening of the squeegee 77. The flux unit 18 is configured to be capable of supplying the flux from the syringe 71 to the storage section 64 via the liquid pumping tube 79. The tips of V-shaped abutting sections 77A and 77B (refer to FIG. 9) of the squeegee 77 which are open downward are portions which scrape the flux film F.

FIG. 4 is a perspective diagram in which a portion of the unit main body section 56 at which the storage section 64 is provided is enlarged. The unit main body section 56 is provided with a height adjustment section 81 which adjusts the height of the squeegee 77. As illustrated in FIG. 4, the height adjustment section 81 is provided with the rocking shaft 83, a rocking arm 84, a rod 86, and an actuator 87. The rocking shaft 83 is formed in a circular rod shape. The rocking shaft 83 is provided to bridge between both edges on the left and right of the frame 67. A through hole is provided along the left-right direction in the bottom section of the squeegee 77, the two plates which are opened in a V-character shape being connected to the bottom section, and the squeegee 77 is fixed to the rocking shaft 83 in a state in which the rocking shaft is inserted through the through-hole. Therefore, the squeegee 77 is configured to be capable of rocking integrally with the rocking shaft 83 around the rocking shaft 83. The rocking arm 84 is provided on the outside of the right side surface of the seat 61, and is formed in a plate shape extending in the up-down direction. In the rocking arm 84, the top end portion of the rocking arm 84 is fixed to the rocking shaft 83 between the end portion of the right side of the squeegee 77 and the inner circumferential surface of the frame 67. A U-character shaped slit 84A which is open downward is formed on the bottom end portion of the rocking arm 84. The rod 86 is formed in a circular rod shape extending in the forward-backward direction, and a pin 86A which is provided on the front end portion of the rod 86 and protrudes from the outer circumferential surface engages with the slit 84A. The rod-shaped rear end of the rod 86 is connected to the output portion of the actuator 87 to be driven thereby. The rod 86 undergoes a change in movement in the forward-backward direction together with the driving of the actuator 87. By driving the actuator 87 and causing the position of the rod 86 to undergo a change in movement in the forward-backward direction, the electronic component mounting machine 10 swings the rocking arm 84 and the rocking shaft 83 and changes the angle (the inclination) of the squeegee 77 in relation to the storage section 64. Accordingly, the electronic component mounting machine 10 adjusts the film thickness of the flux film F which is formed in the storage section 64 using the height adjustment section 81.

Figure 5:
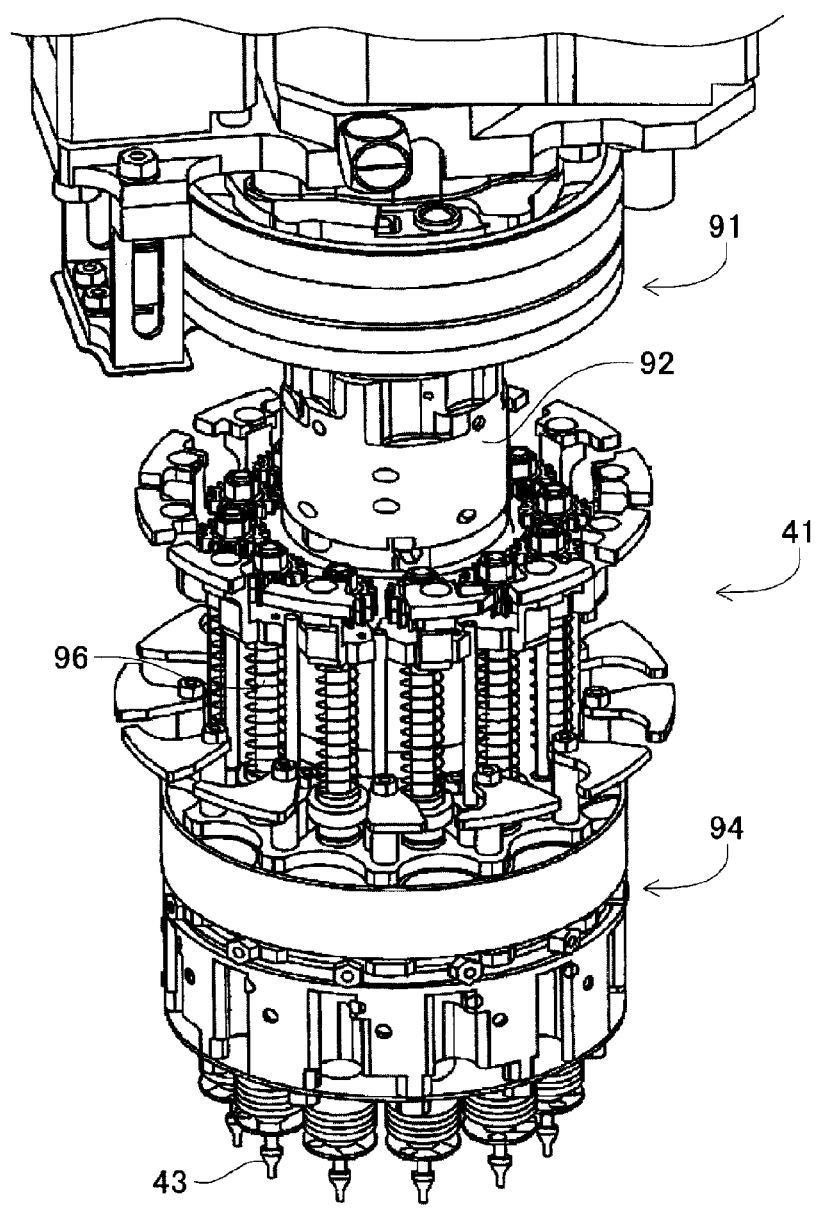
FIG. 5 is a perspective diagram in which a portion of a mounting head with which the electronic component mounting machine is provided is enlarged.

Next, description will be given of the configuration of the mounting head 41. FIG. 5 is an enlarged perspective diagram of the mounting head 41. As illustrated in FIG. 5, in the mounting head 41, a substantially columnar rotating body 92 is attached to the bottom of a main body section 91 which is held by the X-direction slider 33 (refer to FIGS. 1 and 2) in a fixed manner. The rotating body 92 protrudes downward and is configured to be capable of rotating around the rotating shaft extending in the up-down direction. A substantially columnar nozzle holding unit 94 is attached to the bottom of the rotating body 92. The nozzle holding unit 94 is configured to be attachable and detachable in relation to the rotating body 92. A bottomed hole with a slightly larger internal diameter than the external diameter of the rotating body 92 is formed in the inner portion of the nozzle holding unit 94, and a locking claw of the rotating body 92 is locked to a locking target section which is formed in the bottom face of the bottomed hole. The nozzle holding unit 94 is removed from the rotating body 92 by the locking of the locking claw to the locking target section being released and the rotating body 92 being pulled from the bottomed hole. FIG. 5 illustrates a state of the mounting head 41 directly before the nozzle holding unit 94 is mounted to the main body section 91, that is, directly before the rotating body 92 is fitted into the bottomed hole.

The nozzle holding unit 94 is configured to rotate or to be capable of moving in the up-down direction with the rotating body 92 by driving a drive motor (not illustrated) which is provided in the main body section 91. The nozzle holding unit 94 includes twelve rod-shaped nozzle holders 96, and the suction nozzle 43 is mounted to a sleeve 98 (refer to FIG. 6) which is provided on the bottom end portion of each of the nozzle holders 96. The suction nozzle 43 is connected to a positive and negative pressure supply device which is not depicted in the drawings, vacuum holds an electronic component using a negative pressure, and releases the electronic component using a positive pressure. The twelve nozzle holders 96 are held on the outer circumferential portion of the nozzle holding unit 94 at an equal angular pitch along the circumferential direction in a state in which the axial direction thereof is the up-down direction. Each of the suction nozzles 43 extends downward from the bottom face of the nozzle holding unit 94. Each of the nozzle holders 96 and the suction nozzles 43 is configured to rotate around the axial center or to be capable of moving in the up-down direction due to a drive motor (not illustrated) which is provided in the main body section 91.

Figure 6:
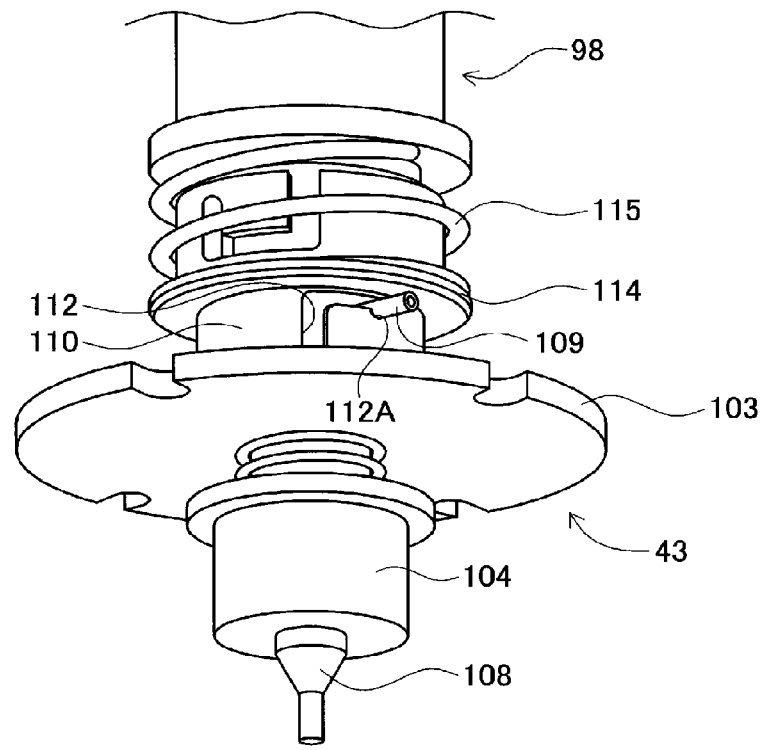
FIG. 6 is a perspective diagram of a suction nozzle in a state of being mounted to a sleeve.
Figure 7:
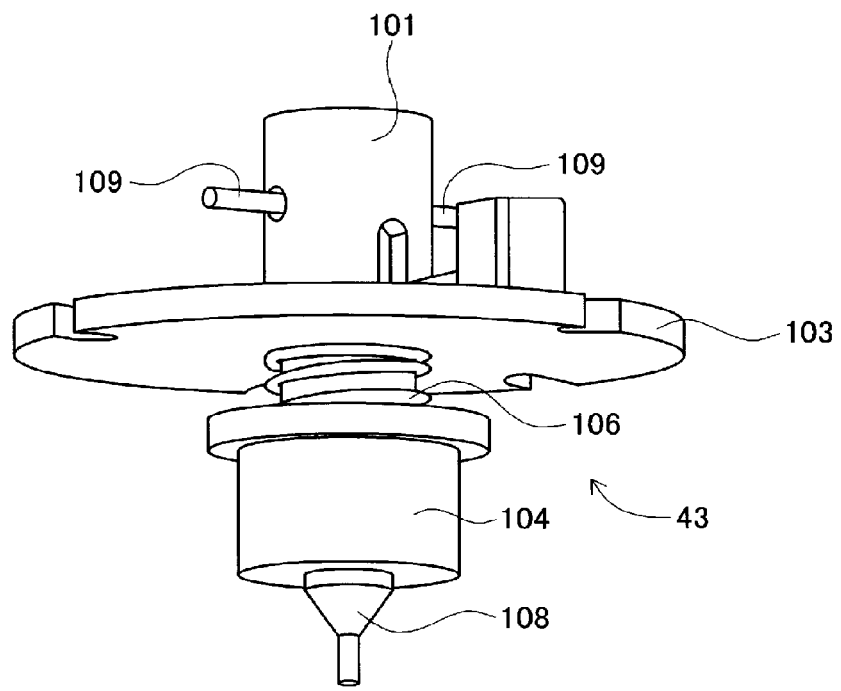
FIG. 7 is a perspective diagram of the suction nozzle in a state of being removed from the sleeve.

FIG. 6 is an enlarged perspective diagram of the suction nozzle 43, and illustrates a state in which the suction nozzle 43 is attached to the sleeve 98 of the nozzle holder 96. The suction nozzle 43 is configured to be capable of being attached and detached in relation to the sleeve 98 which is provided on the bottom end portion of each of the nozzle holders 96 of the nozzle holding unit 94. FIG. 7 illustrates the suction nozzle 43 in a state of being removed from the sleeve 98. As illustrated in FIG. 7, the suction nozzle 43 is provided with a disc-shaped flange 103 which is provided to project from a columnar main cylinder 101 toward the outside in the radial direction. A substantially columnar movable cylinder 104 is provided in the suction nozzle 43 at a position lower than that of the flange 103 on the main cylinder 101. The movable cylinder 104 is held to be capable of extending and retracting in the up-down direction in relation to the main cylinder 101. The movable cylinder 104 is biased toward the tip (the bottom in FIG. 7) side of the suction nozzle 43 by a spring 106 which is provided between the top face of the movable cylinder 104 and the bottom face of the flange 103. A tipped cylinder 108 which is formed in a tapering shape from the bottom face toward the tip is formed on the movable cylinder 104, and the tipped cylinder 108 functions as a nozzle. A supply path which is formed from the base end portion toward the tipped cylinder 108 along the axial direction is formed in the inner portion of the suction nozzle 43. In the suction nozzle 43, the supply path is connected to a positive and negative pressure supply device (not illustrated), and the pressure in a nozzle port of the tipped cylinder 108 is changed according to the air pressure in the supply path.

The suction nozzle 43 includes a pair of engaging pins 109 which extend in the radial direction from the main cylinder 101. Meanwhile, as illustrated in FIG. 6, a cylindrical attachment section 110 which engages with the engaging pins 109 of the suction nozzle 43 is provided on the bottom end portion of the sleeve 98. The attachment section 110 is formed to have a slightly larger internal diameter than the external diameter of the main cylinder 101 of the suction nozzle 43. A pair of slots 112 (only one is depicted in FIG. 6) for fitting the engaging pins 109 is formed in the attachment section 110. Each of the slots 112 is formed from the open portion in the bottom end of the attachment section 110 toward the axial direction of the attachment section 110 at a fixed width in the circumferential direction, is formed toward one of the circumferential directions of the attachment section 110 to continue from the top end portion of the portion which is formed in the axial direction thereof, and overall, is formed in an L-character shape. A locking target section 112A in which a notch is cut downward to match the shape of the engaging pin 109 is formed in the end portion of the portion which is formed in the circumferential direction of the slot 112. The suction nozzle 43 is mounted in a state in which the engaging pins 109 are fitted into the locking target sections 112A of the slots 112. A ring-shaped retainer ring 114 which is capable of moving in the up-down direction is fitted onto the outer circumferential surface of the attachment section 110. The retainer ring 114 is biased to the bottom side by a spring 115 which is provided to cover the outer circumferential surface of the attachment section 110 and is capable of expanding and contracting in relation to the axial direction.

Next, description will be given of an exchanging operation of the suction nozzle 43. The electronic component mounting machine 10 is provided with a nozzle changer 121 (refer to FIG. 2) in which a plurality of types of the suction nozzles 43 are housed. For example, the plurality of suction nozzles 43 are housed in the nozzle changer 121 in a state in which the main cylinder 101 described above is facing upward. The electronic component mounting machine 10 is configured to be capable of automatically exchanging each of the suction nozzles 43 which are mounted in the mounting head 41 with the other suction nozzles 43 which are housed in the nozzle changer 121. Specifically, in a case in which the electronic component mounting machine 10 mounts the suction nozzle 43 which is provided in the nozzle changer 121, the electronic component mounting machine 10 moves the mounting head 41 to the position of the nozzle changer 121. The electronic component mounting machine 10 controls the mounting head 41 to fit the main cylinder 101 of the suction nozzle 43 which is housed in the nozzle changer 121 into the attachment section 110 (refer to FIG. 6) of the arbitrary nozzle holder 96. The mounting head 41 moves the nozzle holder 96 (the sleeve 98) downward such that each of the engaging pins 109 of the suction nozzle 43 moves along the axial direction within the slots 112 of the attachment section 110. Next, the mounting head 41 causes the sleeve 98 to rotate around the axial direction such that each of the engaging pins 109 moves inside the slot 112 in the circumferential direction in a state in which the main cylinder 101 has entered the interior of the attachment section 110. The mounting head 41 rotates the sleeve 98 until the engaging pins 109 are in the positions of the locking target sections 112A of the slots 112 and lifts the position of the sleeve 98. In the suction nozzle 43, due to the retainer ring 114 pushing the engaging pins 109 downward by the biasing force of the spring 115, the suction nozzle 43 is fixed to the sleeve 98 in a state in which the engaging pins 109 are fitted into the locking target sections 112A. Since it is possible for the mounting head 41 to perform the operation of removing the suction nozzle 43 from the sleeve 98 by carrying out the opposite operations from the case in which the suction nozzle 43 is mounted, detailed description thereof will be omitted here.

<Configuration of Film Thickness Gauge 131>

Figure 8:
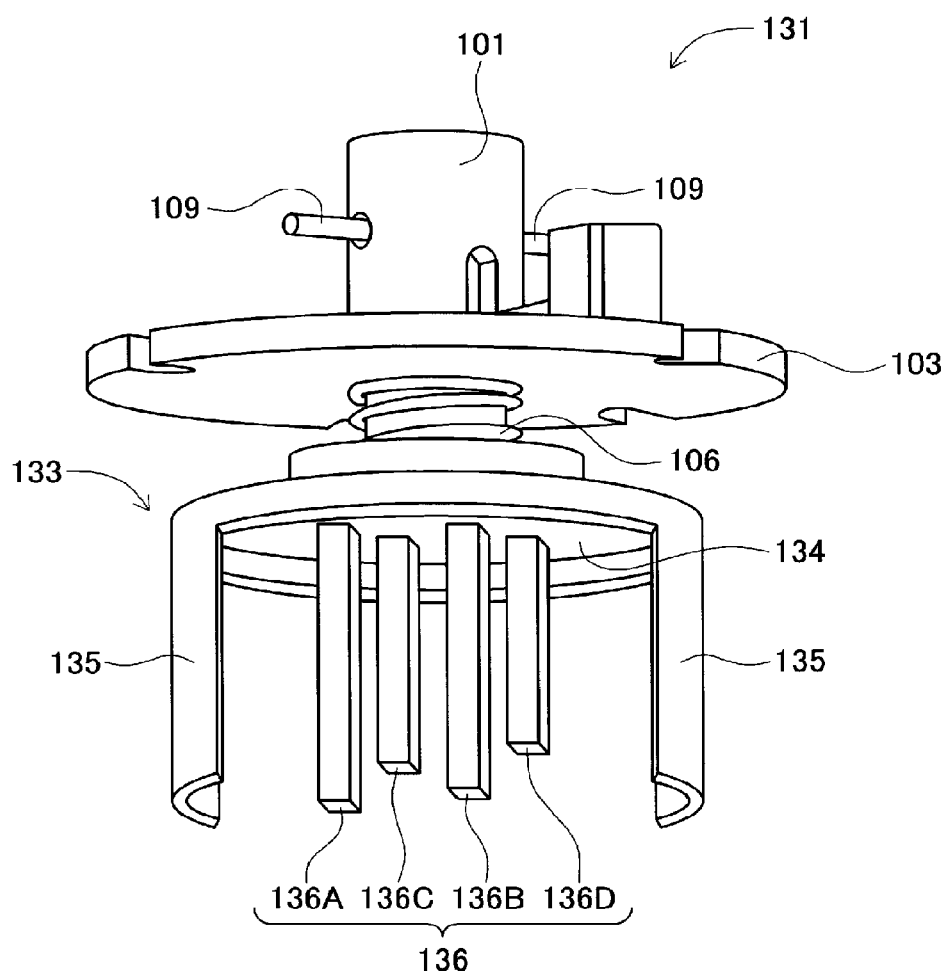
FIG. 8 is a perspective diagram of a film thickness gauge in a state of being removed from the sleeve.

Next, description will be given of the film thickness gauge 131 for measuring the film thickness of the flux film F which is formed in the storage section 64 of the flux unit 18 illustrated in FIG. 4, using FIG. 8. As illustrated in FIG. 8, the film thickness gauge 131 of the present embodiment is formed in a nozzle shape which is capable of being exchanged with the suction nozzle 43. In the following explanation, components which are the same as those of the suction nozzle illustrated in FIG. 7 are given the same symbols, and description thereof will be omitted, as appropriate. A gauge section 133 which is biased to the tip side by the spring 106 is provided on the tip of the main cylinder 101 of the film thickness gauge 131. The gauge section 133 is provided with a circular plate section 134 which is circular, and the main surface of which is perpendicular to the axial direction of the main cylinder 101. The center of the circle of the circular plate section 134 is on the axial line of the rotating shaft of the main cylinder 101, and a pair of positioning sections 135 which are formed along the axial direction toward the tip side are formed on the outer circumferential portion of the circular plate section 134. The positioning section 135 is formed in a plate shape extending in the axial direction, and is formed along the outer circumference of the circular plate section 134, and the sectional shape obtained by cutting the positioning section 135 with a plane which is perpendicular to the axial direction is arc-shaped. Each of the positioning sections 135 is provided in a position facing the other in the radial direction of the circular plate section 134, and the lengths in the axial direction are the same.

A plurality of (in the depicted example, four) measurement sections 136 are formed on the center portion of the circular plate section 134. Each of the measurement sections 136 has a parallelepiped shape which is formed along the axial direction to the tip side from the base end portion which is connected to the circular plate section 134. The measurement sections 136 are disposed in a square formation to surround the center of the circular plate section 134. The measurement sections 136 are shorter in the axial direction than the positioning section 135. The lengths of the measurement sections 136 in the axial direction are different from each other. The electronic component mounting machine 10 measures the film thickness by mounting the film thickness gauge 131 on the sleeve 98 of the suction nozzle 43, dipping the film thickness gauge 131 in the storage section 64 of the flux unit 18, and detecting imprints which are formed in the flux film F using each of the measurement sections 136. Therefore, the length in the axial direction corresponding to the film thickness to be measured is set to each of the measurement sections 136. The measurement sections 136 illustrated in FIG. 8 are depicted using different magnitudes from the actual dimensions. The shapes, arrangement, number, and the like of the measurement sections 136 illustrated in FIG. 8 are exemplary. In the following explanation, in order to distinguish the four measurement sections 136, description will be given referring to the measurement sections 136 as measurement sections 136A, 136B, 136C, and 136D in order from the one which is longest in the axial direction.

The film thickness gauge 131 is housed in the nozzle changer 121 illustrated in FIG. 2 together with the suction nozzle 43. The electronic component mounting machine 10 drives the nozzle holding unit 94 so as to exchange the suction nozzle 43 of the arbitrary nozzle holder 96 with the film thickness gauge 131 according to the timing at which the film thickness of the flux film F is to be measured. For example, each time the type of the circuit boards B1 and B2 (refer to FIG. 1) being produced or the type of the electronic components being supplied is replaced, the electronic component mounting machine 10 exchanges the suction nozzle 43 with the film thickness gauge 131 according to the type in order to adjust the film thickness of the flux film F of the flux unit 18.

Figure 9:
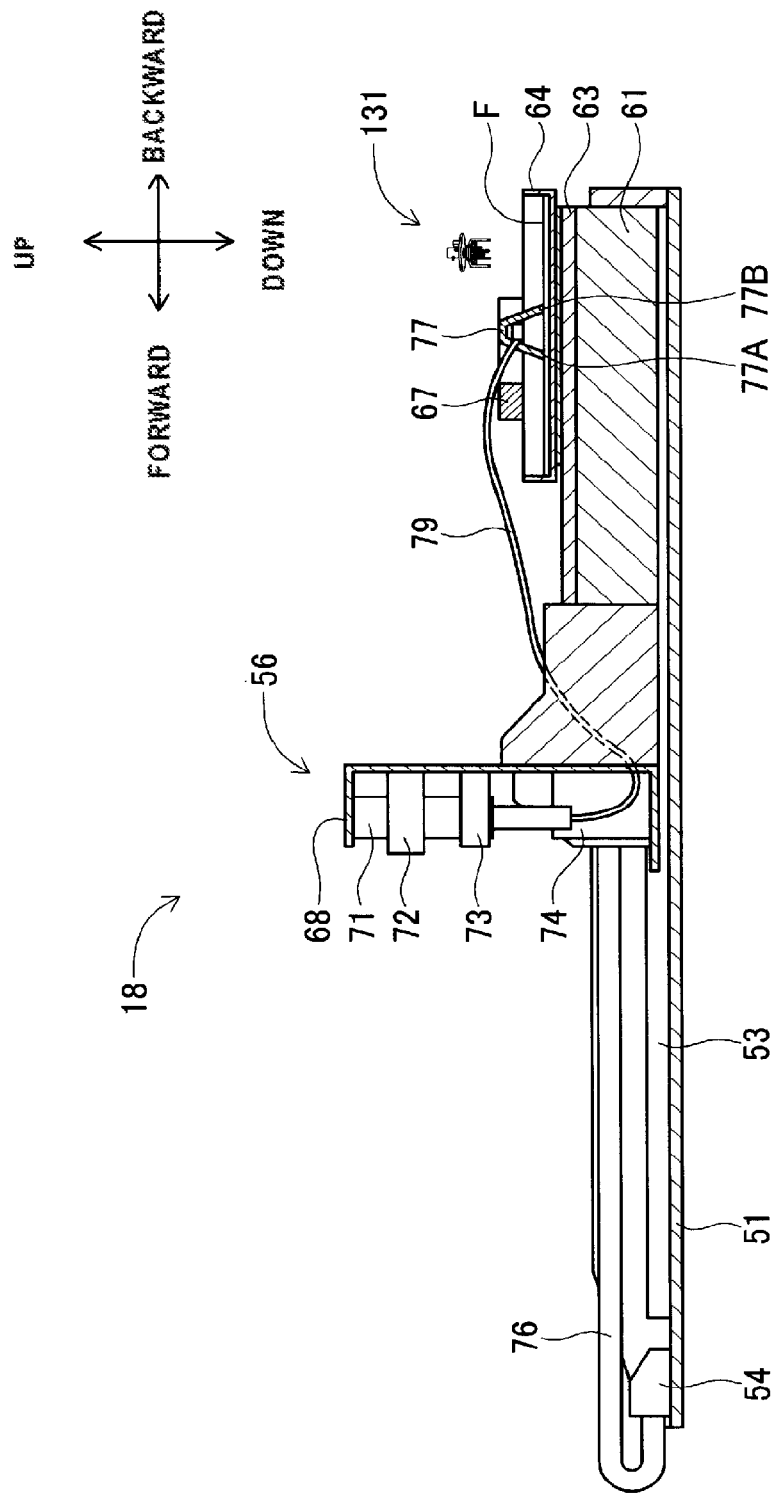
FIG. 9 is a sectional diagram of a flux unit.

Next, description will be given of operations of the formation of the flux film F and the measurement of the film thickness performed by the electronic component mounting machine 10. FIG. 9 is a sectional diagram of the flux unit 18. As illustrated in FIG. 9, the unit main body section 56 is disposed on the rear side of the base section 51 during the production of the circuit boards B1 and B2. The electronic component mounting machine 10 drives the squeegee 77 of the flux unit 18 to form the flux film F of the desired film thickness in the storage section 64. Specifically, first, the electronic component mounting machine 10 moves the storage section 64 to the rear side in relation to the squeegee 77 using an actuator (not illustrated). Accordingly, the squeegee 77 is disposed in the vicinity of the front end of the storage section 64. Next, the electronic component mounting machine 10 changes the inclination of the squeegee 77 to a desired angle by driving the height adjustment section 81 (refer to FIG. 4) of the unit main body section 56. In the squeegee 77, of the V-character shaped abutting sections 77A and 77B which are open downward, the abutting section 77A of the front side is closer to the bottom side than the abutting section 77B of the rear side. The film thickness of the flux film which is formed is changed by the amount by which the abutting section 77A is inclined to the bottom side. After forming the flux film F, the depth by which the tip of the inclined abutting section 77A is dipped in the formed flux film F corresponds to the amount by which the film thickness is adjusted (scraped off).

Next, the electronic component mounting machine 10 supplies the flux from the syringe 71 into the squeegee 77 via the liquid pumping tube 79. The electronic component mounting machine 10 moves the storage section 64 to the front side in relation to the squeegee 77. At this time, the flux film F is formed by the abutting section 77A. The electronic component mounting machine 10 changes the inclination of the squeegee 77 by driving the height adjustment section 81, and brings about a state in which the abutting section 77B of the rear side is more inclined to the bottom side than the abutting section 77A of the front side. The abutting section 77B forms the flux film F due to the electronic component mounting machine 10 moving the storage section 64 to the rear side in relation to the squeegee 77. This work is executed repeatedly, and the flux film F of the desired film thickness is formed.

<Measurement of Film Thickness of Flux Film F>

Next, the electronic component mounting machine 10 measures the film thickness of the flux film F which is formed in the storage section 64 using the film thickness gauge 131. The electronic component mounting machine 10 moves the mounting head 41 to which the film thickness gauge 131 is mounted to the position of the storage section 64. The mounting head 41 lowers the film thickness gauge 131 and dips the positioning sections 135 (refer to FIG. 8) and the measurement sections 136A to 136D in the flux film F which is formed. The position at which the film thickness gauge 131 is lowered is set to match the position at which the electronic components which are to be mounted onto the circuit boards B1 and B2 to be produced are to be dipped. For example, as illustrated in FIG. 4, in the flux film F which is formed in the storage section 64, a dipping region R is set in which to dip the electrodes of the electronic components which are held by the suction nozzles 43. The area of the dipping region R is changed, as appropriate, according to the type of the electronic component and the like. The mounting head 41 executes control which causes the film thickness gauge 131 to be dipped within the dipping region R.

Figure 10:
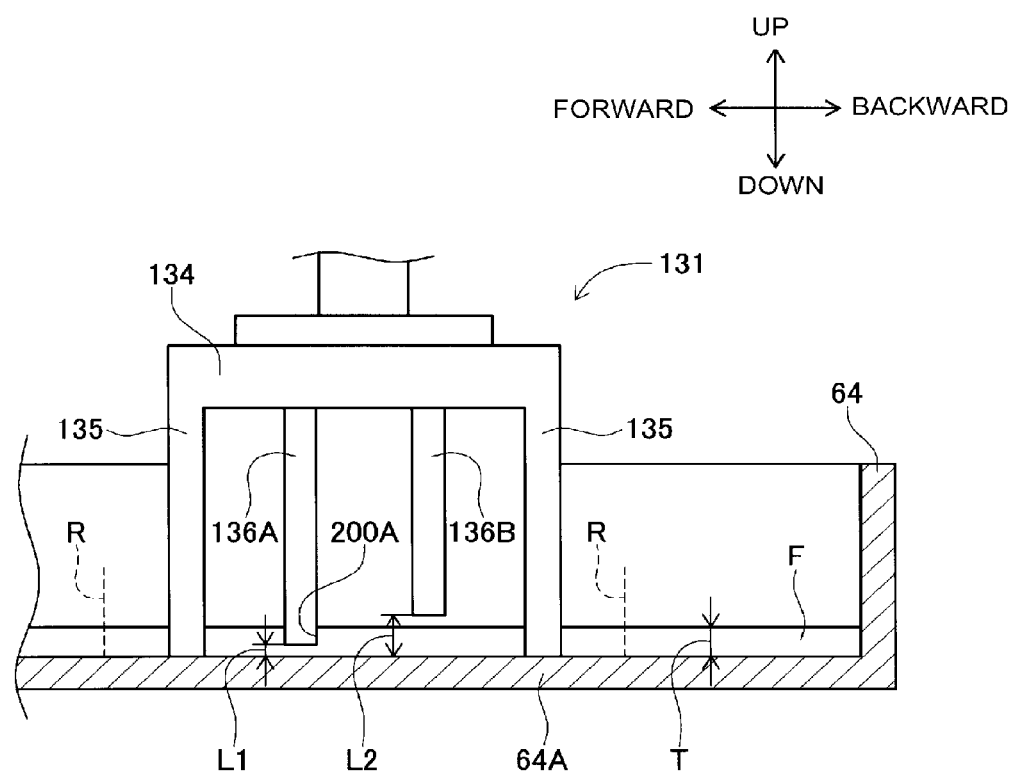
FIG. 10 is a schematic diagram illustrating a state in which the film thickness gauge is dipped in a flux film.

FIG. 10 is a schematic diagram illustrating a state in which the film thickness gauge 131 is dipped in the flux film F. Note that, of the four measurement sections 136A to 136D, FIG. 10 only depicts the two measurement sections 136A and 136B. The mounting head 41 lowers the film thickness gauge 131 until the tip surface of the positioning section 135 abuts a bottom section 64A of the storage section 64. Each of the measurement sections 136A and 136B has a length which is set in the axial direction corresponding to the film thickness to be measured. For example, the film thickness of the flux film F which is formed is a film thickness T. The film thickness T is changed according to the type of the electronic components to be mounted onto the circuit boards B1 and B2 and the shape of the electrodes. The measurement section 136A of the front side in FIG. 10 has a length in the axial direction which is shorter by a length L1 in comparison with the positioning section 135. The measurement section 136B has a length in the axial direction which is shorter by a length L2 in comparison with the positioning section 135. As an example, the film thickness T is 160 µm, for example. The length L1 is 150 µm, for example. The length L2 is 175 µm, for example.

In this case, the measurement section 136A to which the length L1 is set is dipped in the flux film F, and the measurement section 136B to which the length L2 is set is not dipped in the flux film F. Therefore, the surface of the flux film F is depressed by the measurement section 136A, and a measurement mark 200A is formed. The electronic component mounting machine 10 images the measurement mark 200A using the mark camera 37 which is attached to the X-direction slider 33 (refer to FIG. 2), and detects the film thickness T of the flux film F based on the imaging data. Therefore, in each of the measurement sections 136A to 136D, the length (the lengths L1, L2, and the like) by which to shorten the length in the axial direction in comparison with the positioning section 135 is set according to the film thickness T to be measured.

Measurement marks 200A to 200D which are formed by the four measurement sections 136A to 136D illustrated in FIG. 8 are formed inside the dipping region R illustrated in FIG. 4 according to the film thickness T of the flux film F. The electronic component mounting machine 10 detects the measurement marks 200A to 200D based on the imaging data which is obtained by the mark camera 37 imaging the dipping region R. In the example described above, since only the measurement mark 200A is formed without the measurement marks 200B to 200D being formed, the electronic component mounting machine 10 determines that the film thickness T of the dipping region R is between 150 µm and 175 µm.

In a case in which the film thickness of the detected dipping region R is different from the desired film thickness T, the electronic component mounting machine 10 performs a process in which minute adjustment of the angle of the squeegee 77 is automatically performed to render the flux film F thinner or thicker. For example, by driving the height adjustment section 81, adjusting the inclination of the squeegee 77 to an angle at which the abutting sections 77A and 77B are further dipped in the flux film F, and subsequently causing the squeegee 77 to move forward and backward in relation to the storage section 64 after the adjustment, the electronic component mounting machine 10 performs a film thinning process in which the excess portion of the flux film F is scraped off. The electronic component mounting machine 10 performs the measurement of the film thickness T again after adjusting the film thickness T.

In a case in which the film thickness T of the detected dipping region R matches the film thickness corresponding to the electronic components to be mounted, the electronic component mounting machine 10 starts the mounting work of the electronic components after executing a process of forming the flux film F again without changing the angle of the squeegee 77 in order to remove the measurement marks 200A to 200D which are formed for the measurement. The electronic component mounting machine 10 dips the electrodes of the electronic component which is vacuum held by the suction nozzle 43 (refer to FIG. 6) in the dipping region R of the flux film F of the storage section 64 by driving the mounting head 41. An amount of flux corresponding to the film thickness of the flux film F is adhered to the electrodes of the electronic component. The electronic component mounting machine 10 passes the electronic component to which the flux is adhered over the parts camera 15 (refer to FIGS. 1 and 2) with the electronic component still sucked by the suction nozzle 43. The electronic component mounting machine 10 performs the adjustment based on the error and the like of the orientation of the electronic component which is imaged by the parts camera 15, and mounts the electronic component onto the circuit board B1 or the circuit board B2. In this manner, the electronic component mounting machine 10 performs the mounting work while adjusting the film thickness T of the flux film F according to the type of the electronic component being supplied, or the like.

The present embodiment described in detail above has the following effects.

<Effect 1> The electronic component mounting machine 10 of the present embodiment is provided with the flux unit 18 which transfers the flux onto the electrodes of the electronic component. The flux unit 18 forms the flux film F by spreading the flux which is stored in the storage section 64 using the squeegee 77. The electronic component mounting machine 10 is provided with the film thickness gauge 131 for measuring the film thickness T of the flux film F. The film thickness gauge 131 is configured to be capable of being mounted to the mounting head 41 which holds the electronic components. The film thickness gauge 131 is provided with the measurement sections 136A to 136D which are formed at lengths in the axial direction corresponding to the measurement values of the film thickness T. The mounting head 41 moves to a position above the storage section 64 and lowers the film thickness gauge 131 to cause the film thickness gauge 131 to come into contact with the surface of the flux film F. The film thickness gauge 131 forms the measurement marks 200A to 200D in the flux film F corresponding to the film thickness T using each of the measurement sections 136A to 136D. The electronic component mounting machine 10 images the measurement marks 200A to 200D which are formed in the flux film F using the mark camera 37 and executes the detection process of the measurement marks 200A to 200D based on the imaging data. The electronic component mounting machine 10 determines the film thickness T of the flux film F which is actually formed, from the detected measurement marks 200A to 200D.

In this configuration, it becomes possible for the electronic component mounting machine 10 to automatically manage the film thickness T according to the type of the electronic components being supplied, and the work efficiency is improved. Here, for example, in a case in which a worker of the electronic component mounting machine 10 measures the film thickness T by manual work, it is possible that human error will occur such as the worker forgetting to perform the measurement work at the necessary timing, or the position of the film thickness gauge held in the hand of the worker shifting and it not being possible to measure the correct value of the film thickness T. In a case in which the worker measures the film thickness T by manual work, for example, it is necessary to stop the production line and pull the flux unit 18 out along the device table 16 before performing the measurement, and the production efficiency of the circuit boards B1 and B2 is reduced. In contrast, according to the electronic component mounting machine 10 of the present embodiment, since human error is removed, and the film thickness is adjusted automatically in the flow of production processes, the production efficiency is improved.

In the related art, due to a laser sensor or the like for measuring the film thickness T being installed, a dedicated power source device or the like for driving the sensor becomes necessary, and there is a concern that the structure of the device will become more complex and the size of the device itself will increase. In contrast, in the electronic component mounting machine 10 of the present embodiment, according to the configuration in which the film thickness gauge 131 is held by the mounting head 41 and the measurement is performed, it becomes possible to measure the film thickness T without using a sensor or the like, it is possible to obtain simplification in the structure of the device and a reduction in the size of the device, and thus, it is possible to obtain a reduction in the manufacturing costs of the device.

<Effect 2> The flux unit 18 is provided with the V-character shaped squeegee 77 which forms the flux film F of the desired film thickness T by coming into contact with the surface of the flux which is stored in the storage section 64. The electronic component mounting machine 10 drives the height adjustment section 81 of the flux unit 18 according to the detected film thickness T to change the inclination of the squeegee 77, and the relative heights of the abutting sections 77A and 77B of the squeegee 77 are changed in relation to the bottom section 64A of the storage section 64. In a case in which the heights of the abutting sections 77A and 77B are high, the film thickness T of the flux film F which is formed is increased. In a case in which the heights of the abutting sections 77A and 77B are low, the film thickness T is reduced. Therefore, the electronic component mounting machine 10 becomes capable of forming the flux film F of the desired film thickness T by adjusting the heights of the abutting sections 77A and 77B according to the detected film thickness T.

<Effect 3> The position at which the film thickness gauge 131 comes into contact with the flux film F is set to be in the dipping region R in which the electronic component which is held by the mounting head 41 is dipped in the flux film F. In other words, the position at which to measure the film thickness T is the position at which to actually dip the electronic component. Therefore, in the electronic component mounting machine 10 of the present embodiment, it is possible to more appropriately manage the amount of the flux to be transferred onto the electrodes of the electronic component, and thus, it is possible to obtain an improvement in the yield by reducing the number of faulty printed circuit boards which are discarded in the subsequent processes.

<Effect 4> The film thickness gauge 131 is held by the mounting head 41. By driving the nozzle holding unit 94 and the nozzle holder 96, the mounting head 41 causes the film thickness gauge 131 to come into contact with the flux film F. According to the electronic component mounting machine 10, it is not necessary to separately provide a dedicated moving device for holding and moving the film thickness gauge 131, and it becomes possible to appropriately manage the film thickness T while obtaining simplification in the structure of the device.

<Effect 5> The film thickness gauge 131 is formed in a nozzle shape which is capable of being exchanged with the suction nozzle 43 in the nozzle holder 96 (the sleeve 98) of the mounting head 41 (refer to FIG. 8). The electronic component mounting machine 10 drives the mounting head 41 so as to exchange the suction nozzle 43 with the film thickness gauge 131 according to the timing at which the film thickness of the flux film F is to be measured. Accordingly, it becomes possible for the electronic component mounting machine 10 to automatically measure the film thickness T at an appropriate timing such as the timing at which the type of the electronic component being supplied is replaced.

<Effect 6> In the film thickness gauge 131, when the mounting head 41 lowers the nozzle holder 96 during the measurement of the flux film F, the tip surfaces of the positioning sections 135 abut the bottom section 64A of the storage section 64 and the position of the film thickness gauge 131 is determined (refer to FIG. 10). The measurement sections 136A to 136D which have different lengths along the axial direction are formed in the film thickness gauge 131. The measurement sections 136A to 136D are in positions in which the relative heights in relation to the bottom section 64A are different from each other in a state in which the positioning sections 135 abut the bottom section 64A of the storage section 64. According to the film thickness gauge 131, since the positioning sections 135 are caused to abut and the measurement positions are determined in a stable manner, it becomes possible to precisely form the measurement marks 200A to 200D corresponding to the film thickness T in the flux film F.

<Effect 7> In the electronic component mounting machine 10 of the present embodiment, the mark camera 37 for imaging the fiducial marks, the model number, and the like attached to the surfaces of the circuit boards B1 and B2 is also used as imaging means for imaging the measurement marks 200A to 200D, and it is not necessary to provide a dedicated camera or the like separately.

Here, the mark camera 37 is an example of an imaging section. The mounting head 41 which is provided with the suction nozzle 43 is an example of a movable section. The suction nozzle 43 is an example of a mounting nozzle. The flux is an example of a viscous fluid. The flux film F is an example of a fluid film.

The present disclosure is not limited to the embodiment described above, and it goes without saying that various improvements and modifications are possible within a scope that does not depart from the gist of the present disclosure. For example, in the embodiment described above, the film thickness gauge 131 is configured to be capable of being mounted to the mounting head 41; however, for example, the embodiment may be modified to a configuration in which the film thickness gauge 131 is held and moved by a moving device which is provided separately from the mounting head 41 and the XY robot 31. In the embodiment described above, the film thickness gauge 131 is formed in a nozzle shape which is capable of being exchanged with the suction nozzle 43; however, the disclosure is not limited thereto. For example, a configuration may be adopted in which the film thickness gauge 131 is formed in a plate shape, and the plurality of measurement sections 136A to 136D are formed in comb tooth shapes. The mounting head 41 may be configured to mechanically pinch the plate-shaped film thickness gauge 131. The plate-shaped film thickness gauge 131 used in this case may be a preexisting film thickness gauge for measuring a film thickness which is generally used. Alternatively, the mounting head 41 may be configured to suck and release the film thickness gauge 131 by means of electromagnetic force.

In the embodiment described above, the shape of the measurement section 136 (the measurement sections 136A to 136D) is a parallelepiped shape; however, the shape is not particularly limited. The shape of the measurement section 136 may be a prism shape other than a parallelepiped, and may be columnar. However, when considering the shape of the measurement section 136 formed by machining, machining is easier if the shape of the measurement section 136 is a parallelepiped. When considering the cleaning of the measurement section 136 using a brush or the like, cleaning is easier if the shape of the measurement section 136 is a prism shape in comparison with a columnar shape. The arrangement, number, and the like of the measurement sections 136 which are provided in the film thickness gauge 131 are exemplary, and are not particularly limited. The electronic component mounting machine 10 may be provided with a plurality of types of the film thickness gauges 131. In this case, the shapes of the measurement sections 136 which are provided in each of the film thickness gauges 131 may be different from each other. One of the film thickness gauges 131 may be provided with measurement sections 136 of different shapes from each other. In the embodiment described above, the film thickness gauge 131 is formed to be attachable and detachable in relation to the mounting head 41; however, the film thickness gauge 131 may be provided in a fixed manner in relation to the mounting head 41.

Figure 11:
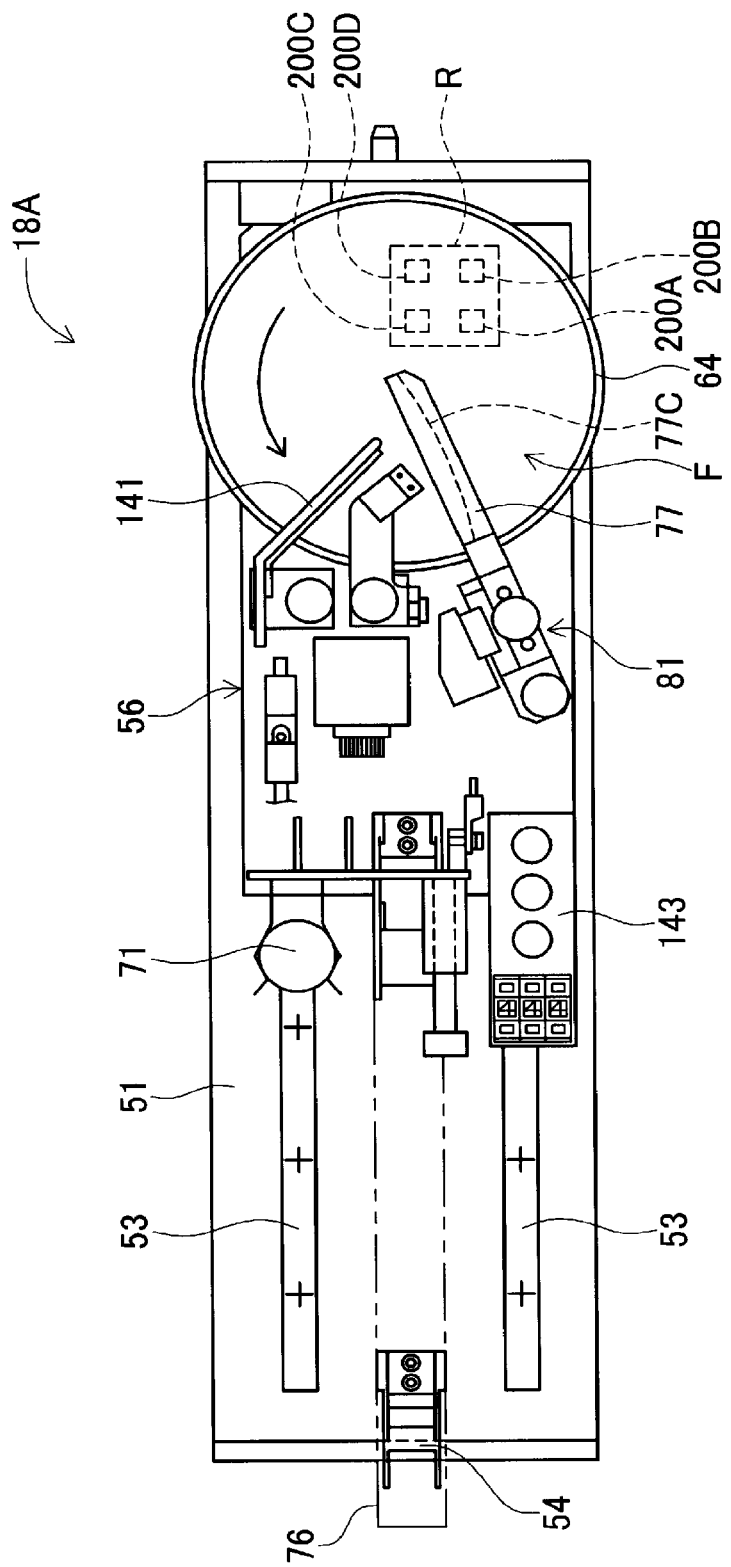
FIG. 11 is a top face diagram of a flux unit of a different example.

The configuration of the flux unit 18 of the embodiment described above is exemplary, and it is possible to modify the configuration, as appropriate. For example, in the embodiment described above, the flux unit 18 is configured such that the squeegee 77 moves linearly in relation to the storage section 64; however, the configuration is not limited thereto. FIG. 11 is a top face diagram of a flux unit 18A of a different example. In the following explanation, components which are the same as those of the flux unit 18 of the embodiment described above are given the same symbols, and description thereof will be omitted, as appropriate. The flux unit 18A illustrated in FIG. 11 is provided with the circular storage section 64. The storage section 64 is disposed on a rotating table and is configured to be capable of rotating in the direction of the arrow in the diagram. Flux which is inside the syringe 71 is supplied from an ejecting nozzle 141, and the flux is stored in the storage section 64. The plate-shaped squeegee 77 of approximately the same length as the radius of the storage section 64 is disposed along the radial direction above the storage section 64. By driving the rotating table to rotate the storage section 64, the flux unit 18A spreads the flux inside the storage section 64 over the straight line of the squeegee 77 using an abutting section 77C to form the flux film F.

The height adjustment section 81 which adjusts the height (the position in a direction perpendicular to the paper surface in FIG. 11) of the squeegee 77 is provided in the flux unit 18A, and the height adjustment section 81 changes the film thickness of the flux film F by adjusting the height of the squeegee 77 and adjusting the gap between the squeegee 77 and the bottom section of the storage section 64. Even in the flux unit 18A of this configuration, it becomes possible to appropriately manage the film thickness of the flux film F by setting the dipping region R in which to dip the electronic components and performing measurement using the film thickness gauge 131 in the same manner as in the embodiment described above.

In the embodiment described above, the electronic component mounting machine 10 is configured to adjust the film thickness T automatically according to the measurement result; however, a configuration may be adopted in which the worker is notified of the measurement result, and the worker manually performs the adjustment. The flux unit 18A depicted in FIG. 11 is provided with an operation panel 143 for performing manual pull-out operation in which the unit main body section 56 is caused to slide over the device table 16 (refer to FIG. 1). If the worker performs manual operation by operating the operation panel 143 in a state in which the unit main body section 56 is in the pulled-out position, the flux unit 18A is capable of rotating the storage section 64 and forming a flux film F, replenishing the storage section 64 with the flux from the syringe 71 and the like in order to adjust the film thickness of the flux film F. In this configuration, for example, due to the electronic component mounting machine 10 displaying the measurement result of the film thickness on the operation panel or the like, it becomes possible for the worker to adjust the film thickness of the flux film F by operating the operation panel 143 according to the display of the operation panel.

The flux unit 18 may also be configured such that a plurality of the flux films F with different film thicknesses are formed in the single storage section 64. The dipping region R may be set to a plurality of positions. The measurement by the film thickness gauge 131 may be performed at a plurality of locations in a single measurement, and, for example, the average value thereof or the like may be calculated and used as the measurement result.

The viscous fluid in the present embodiment is not limited to the flux, and may be another viscous fluid (for example, cream solder). In the embodiment described above, the electronic component mounting machine 10 is configured to also use the mark camera 37, which is also used for other purposes, as an imaging section for imaging the measurement marks 200A to 200D; however, the electronic component mounting machine 10 may be provided with a dedicated camera for imaging the measurement marks 200A to 200D. In this case, the flux unit 18 may be provided with the dedicated camera. In the embodiment described above, the mounting head 41 is provided with the suction nozzle 43 which sucks and holds the electronic component using changes in air pressure as a mounting nozzle which holds the electronic component; however, the mounting head 41 may be provided with a mounting nozzle of a configuration in which the electronic component is held by another method.

REFERENCE SIGNS LIST

10: electronic component mounting machine, 37: mark camera, 41: mounting head, 64: storage section, 64A: bottom section, 77: squeegee, 81: height adjustment section, 131: film thickness gauge, 135: positioning section, 136, 136A to 136D: measurement section, 200A to 200D: measurement mark, F: flux film, R: dipping region, T: film thickness

The invention claimed is:

1. An electronic component mounting machine comprising:
 a vessel in which a viscous fluid is stored and a fluid film of the viscous fluid is formed;

a head which holds an electronic component, moves, and dips the electronic component in the fluid film;

a film thickness gauge which forms at least one measurement mark corresponding to at least one measurement value in the fluid film by coming into contact with the fluid film, the at least one measurement mark being for measuring a film thickness of the fluid film, the film thickness gauge including:

a positioning extension which abuts a bottom of the vessel when coming into contact with the fluid film and determines the position of the film thickness gauge, and a plurality of measurement extensions, heights of which are different from each other relative to the bottom, and which form the at least one measurement mark corresponding to the film thickness in the fluid film in a state where the positioning extension is brought into contact with the bottom of the vessel; and an image sensor which images the at least one measurement mark which is formed in the fluid film by the film thickness gauge, wherein the electronic component mounting machine detects the film thickness of the fluid film based on imaging data by the image sensor.

2. The electronic component mounting machine according to claim 1, further comprising:

a squeegee which comes into contact with the viscous fluid and forms the fluid film of the film thickness corresponding to a height relative to the vessel; and an actuator which changes a height of the squeegee relative to the vessel according to the film thickness of the fluid film which is detected, and adjusts the film thickness.

3. The electronic component mounting machine according to claim 1, wherein a position at which the film thickness gauge comes into contact with the fluid film is set to be in a dipping region in which the electronic component which is held by the head is dipped in the fluid film.

4. The electronic component mounting machine according to claim 1, wherein the film thickness gauge is held by the head and comes into contact with the fluid film according to movement of the head.

5. The electronic component mounting machine according to claim 4, wherein the head is configured such that a mounting nozzle which holds the electronic component is capable of being attached and detached;

wherein the film thickness gauge is configured to be exchangeable with the mounting nozzle in relation to the head; and the head is driven to exchange the mounting nozzle and the film thickness gauge according to a timing at which the film thickness of the fluid film is to be measured.

* * * * *